(12) United States Patent
Taguchi et al.

(10) Patent No.: US 8,455,899 B2
(45) Date of Patent: Jun. 4, 2013

(54) RESIN COMPOSITION, REFLECTOR FOR LIGHT-EMITTING SEMICONDUCTOR DEVICE, AND LIGHT-EMITTING SEMICONDUCTOR UNIT

(75) Inventors: Yusuke Taguchi, Annaka (JP); Toshio Shiobara, Tokyo (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 10 days.

(21) Appl. No.: 13/074,317

(22) Filed: Mar. 29, 2011

(65) Prior Publication Data

US 2011/0241048 A1  Oct. 6, 2011

(30) Foreign Application Priority Data

Mar. 30, 2010 (JP) ................. 2010-078036

(51) Int. Cl.
*H01L 33/00* (2010.01)
*H01L 23/29* (2006.01)
*F21V 7/00* (2006.01)
*C08K 5/00* (2006.01)

(52) U.S. Cl.
USPC .............. 257/98; 362/341; 523/457; 257/793

(58) Field of Classification Search
USPC .................. 523/400; 524/430, 431, 433, 437, 524/588, 879
See application file for complete search history.

(56) References Cited

U.S. PATENT DOCUMENTS

| | | | |
|---|---|---|---|
| 6,774,405 B2 * | 8/2004 | Yasukawa et al. | 257/99 |
| 2006/0241215 A1 * | 10/2006 | Osada et al. | 523/457 |
| 2007/0029682 A1 * | 2/2007 | Aoki et al. | 257/793 |
| 2009/0203822 A1 * | 8/2009 | Shiobara et al. | 524/267 |
| 2009/0306263 A1 * | 12/2009 | Taguchi et al. | 524/404 |
| 2010/0072416 A1 * | 3/2010 | Fujioka et al. | 252/67 |
| 2010/0148380 A1 * | 6/2010 | Hayashi et al. | 257/793 |
| 2010/0273927 A1 * | 10/2010 | Taguchi et al. | 524/433 |

FOREIGN PATENT DOCUMENTS

| | | |
|---|---|---|
| EP | 1 796 179 A1 | 6/2007 |
| JP | 2006-140207 A | 6/2006 |
| JP | 2007-297601 A | 11/2007 |
| TW | 200809050 A | 2/2008 |
| WO | 2008/047851 A1 | 4/2008 |
| WO | WO 2008047851 A1 * | 4/2008 |
| WO | WO2008047851 A1 * | 4/2008 |

OTHER PUBLICATIONS

Extended European Search Report, dated Dec. 16, 2011, for European Application No. 11002552.5.

* cited by examiner

*Primary Examiner* — Ha Tran T Nguyen
*Assistant Examiner* — Dzung Tran
(74) *Attorney, Agent, or Firm* — Birch, Stewart, Kolasch & Birch, LLP

(57) ABSTRACT

Disclosed herein is a resin composition including 100 parts by weight of an organic resin and 50 to 1,000 parts by weight of an inorganic filler, wherein 10 to 100% of the inorganic filler is composed of an oxide of a rare earth element.

15 Claims, 3 Drawing Sheets

RESIN COMPOSITION, REFLECTOR FOR LIGHT-EMITTING SEMICONDUCTOR DEVICE, AND LIGHT-EMITTING SEMICONDUCTOR UNIT

CROSS-REFERENCE TO RELATED APPLICATION

This non-provisional application claims priority under 35 U.S.C. §119(a) on Patent Application No. 2010-078036 filed in Japan on Mar. 30, 2010, the entire contents of which are hereby incorporated by reference.

TECHNICAL FIELD

This invention relates to a resin composition most suited for application as a reflector for a light-emitting semiconductor device. This invention also relates to a reflector having an optimal reflectance as a reflector for a light-emitting semiconductor device, which in particular has wavelengths of up to 500 nm, and further to a light-emitting semiconductor unit making use of the reflector.

BACKGROUND ART

Resin-made reflectors for use with light-emitting semiconductor devices, for example, light-emitting diodes (LEDs) are widely known for many years.

In general, reflectors used in light-emitting diodes are made of thermoplastic resins such as PPA (polyphthalamide) with white pigments such as titanium oxide added therein. Practically all light-emitting diodes currently use reflectors molded of these materials.

On the other hand, still higher luminance and durability are required for light-emitting diodes in the field of lighting. A great deal of labor is therefore bestowed on making improvements in brightness per unit power consumption by using shorter-wavelength light-emitting diodes.

Under these circumstances, there is a strong demand from the market for improvements in photoreflectance at low wavelengths and higher durability with respect to reflectors.

As reflectors for light-emitting semiconductor devices, PPA resin has heretofore been used widely. Recently, those molded of thermosetting resins, each of which is composed of an epoxy resin, curing agent and filler and has a reflectance of 80% or higher in the wavelength range of 350 to 800 nm and a thermal conductivity of 1 to 10 W/K, have been exemplified in JP-A 2006-140207 and JP-A 2007-297601.

It is described that a white pigment such as alumina, magnesium oxide, antimony oxide, aluminum hydroxide, barium sulfate, magnesium carbonate or barium carbonate is used to maintain the reflectance at 80% or higher in the above-described wavelength range. To maintain with such a pigment the reflectance at 80% or higher in the wavelength range of 350 to 800 nm, the pigment has to be added in a large amount. Further, the pigments other than alumina involve many problems such as high moisture absorbance and water solubility, and therefore, are not suited for high-reliability reflectors.

Further, the use of PPA resin or epoxy resin in reflectors for light-emitting diodes that emit intense short-wavelength light may cause such inconvenience that the resin is degraded and discolored by the light and the reflectance is lowered.

SUMMARY OF INVENTION

Therefore, an object of the present invention is to provide a resin composition capable of affording a cured product, which can retain whiteness, heat resistance, moisture resistance and light resistance, is uniform, does not undergo much yellowing, has a reflectance of 80% or higher in a wavelength range of 300 to 500 nm, especially 400 to 500 nm, is low in deflection upon curing, and is effective for molding a reflector for a light-emitting semiconductor device. Another object of the present invention is to provide a reflector for a light-emitting semiconductor device, which makes use of the resin composition. A further object of the present invention is to provide a light-emitting semiconductor unit making use of the reflector.

The present inventors enthusiastically conducted research to achieve the above-described objects. As a result, it has been found that the use of an oxide of a rare earth element as an inorganic filler for use in the molding of a reflector for a light-emitting semiconductor device is effective and the resulting reflector does not undergo much reductions in photoreflectance and luminance.

Therefore, the present invention provides a resin composition, a reflector for a light-emitting semiconductor device, and a light-emitting semiconductor unit as follows.

In one aspect of the present invention, there is thus provided a resin composition comprising 100 parts by weight of an organic resin and 50 to 1,000 parts by weight of an inorganic filler, wherein 10 to 100% of the inorganic filler is composed of an oxide of a rare earth element.

The organic resin may preferably be a polyphthalamide, epoxy or silicone resin. Preferably, 5 to 100% by weight of the organic resin may be composed of a silicone resin. The rare earth element may preferably be selected from yttrium, neodymium, indium, lanthanum, cerium, samarium, europium, gadolinium or dysprosium. The oxide of the rare earth element may preferably be in the form of a powder having an average particle size of 0.5 to 60 µm.

The resin composition may further include, as an inorganic filler other than the oxide of the rare earth element, an oxide of an element selected from silicon, magnesium, titanium, zinc or aluminum. The resin composition may preferably be for the molding of a reflector for a light-emitting semiconductor device.

In another aspect of the present invention, there is also provided a reflector for a light-emitting semiconductor device, which includes a cured product of the above-described resin composition.

The reflector may preferably be in the form of a flat plate configured such that the reflector can fill up between a die pad on which a light-emitting semiconductor device is mounted, and leads via which electrodes of the light-emitting semiconductor device and external electrodes are connected together, respectively.

As an alternative, the reflector may be in the form of a recessed body configured as a ring-shaped wall member such that the reflector can be arranged on leads via which electrodes of a light-emitting semiconductor device and external electrodes are connected together, respectively, or a die pad on which the leads and the electrodes of the light-emitting semiconductor device are mounted, and can accommodate the light-emitting semiconductor device therein. Preferably the reflector may be configured to fill up between the leads or between the leads and the die pad in continuation with the ring-shaped wall member.

In a further aspect of the present invention, there is also provided a light-emitting semiconductor unit comprising a light-emitting semiconductor device, leads connecting electrodes of the light-emitting semiconductor device with external electrodes, respectively, and the above-described reflector, wherein the light-emitting semiconductor device is sealed with a transparent resin. The transparent resin may preferably include a phosphor. The light-emitting semiconductor device may preferably have emission wavelengths of not longer than 500 nm.

ADVANTAGEOUS EFFECTS OF INVENTION

The use of the resin composition according to the present invention can provide a reflector for a light-emitting semiconductor device, and can also provide a light-emitting semiconductor unit. These reflector and light-emitting semiconductor unit have high photoreflectance, and do not undergo much reduction in luminance.

BRIEF DESCRIPTION OF DRAWINGS

FIGS. 1A and 1B illustrate one example of a recessed reflector, in which FIG. 1A is a cross-sectional view of the example taken along line X-X of FIG. 1B, and FIG. 1B is a plan view of the example without a light-emitting semiconductor device and gold wire;

FIGS. 3A and 3B illustrate one example of a discrete-type recessed reflector, in which FIG. 3A is a cross-sectional view of the example, and FIG. 3B is a plan view of the example;

FIGS. 5A and 5B illustrate one example of matrix-type flat-plate reflectors, in which FIG. 5A is a plan view of the example without a light-emitting semiconductor device and gold wire, and FIG. 5B is a cross-sectional view of the example taken along line Y-Y of FIG. 5A.

DESCRIPTION OF EMBODIMENTS

The resin composition according to the present invention contains an organic resin and inorganic filler as essential components.

As the organic resin for use in the present invention, a thermoplastic resin and a thermosetting resin are both usable. As the thermoplastic resin, polyphthalamide (PPA) which has been widely used for years is representative.

Examples of the thermosetting resin include epoxy resins, silicone resins, composite resins of silicone resins and organic resins, and the like.

As the epoxy resins, bisphenol epoxy resin, cresol novolac epoxy resin, alicyclic epoxy resin, aliphatic epoxy resin, biphenyl epoxy resin, aralkyl epoxy resin, and the like can be exemplified. When these epoxy resins are used, it is preferred to use acid anhydrides, various phenol resins, various amine compounds or the like as curing agents to cure them.

Specifically, a thermosetting resin composition comprising a triazine derivative epoxy resin such as triglycidyl isocyanurate as an epoxy resin, an acid anhydride as a curing agent and a curing promoter such as a phosphorus-based curing promoter is particularly desired for its excellent heat resistance and light resistance.

The proportion of the curing agent may preferably range, per 100 parts by weight of the epoxy resin, from 20 to 400 parts by weight in the case of an acid anhydride, from 10 to 300 parts by weight in the case of a phenol resin, and from 5 to 200 parts by weight in the case of an amine compound. The curing promoter may be used in an amount of 0.1 to 5 parts by weight per 100 parts by weight of the epoxy resin.

As the silicone resins, condensation-curable or addition-curable thermosetting silicone resins can be exemplified.

The condensation-curable silicone resins can include silicone resins represented by the following formula (1):

$$R^1_a Si(OR^2)_b (OH)_c O_{(4-a-b-c)/2} \tag{1}$$

wherein $R^1$ is, identical or different, an organic group having 1 to 20 carbon atoms, $R^2$ is, identical or different, an organic group having 1 to 4 carbon atoms, and a, b and c are numbers that satisfy $0.8 \leq a \leq 1.5$, $0 \leq b \leq 0.3$, $0.001 \leq c \leq 0.5$, and $0.801 \leq a+b+c \leq 2$. Condensation-curable silicone resin compositions comprising such a silicone resin and a condensation catalyst are preferred.

Examples of the organic groups as $R^1$ are monovalent hydrocarbon groups having 1 to 20 carbon atoms, preferably 1 to 15 carbon atoms, more preferably 1 to 10 carbon atoms. Alkyl groups, alkenyl groups, aryl groups, aralkyl groups, and the like can be exemplified. On the other hand, examples of the organic groups as $R^2$ are alkyl groups, alkenyl groups, acyl groups, and the like.

Examples of the condensation catalysts include basic compounds such as trimethylbenzylammoniuim hydroxide, tetramethylammonium hydroxide, n-hexylamine, tributylamine, diazabicycloundecene (DBU), and dicyandiamide; metal-containing compounds such as tetraisopropyl titanate, tetrabutyl titanate, titanium acetylacetonate, aluminum triisobutoxide, aluminum triisopropoxide, zirconium tetra (acetylacetonate), zirconium tetrabutyrate, cobalt octylate, cobalt acetylacetonate, iron acetylacetonate, tin acetylacetonate, dibutyl tin octylate, dibutyl tin laurate, zinc octylate, zinc benzoate, zinc p-tert-butylbenzoate, zinc laurate, zinc stearate, aluminum phosphate, aluminum triisopropoxide, aluminum trisacetylacetonate, and aluminum monoacetyl acetonate bis(ethylacetate); and organic titanium chelate compounds such as diisopropoxy-bis(methylaceto-acetate) titanium and diisopropoxy-bis(ethylacetoacetate)-titanium. Of these, preferred are zinc octylate, zinc benzoate, zinc p-tert-butylbenzoate, zinc laurate, zinc stearate, aluminum phosphate, aluminum triisopropoxide, and organic titanium chelate compounds, with zinc benzoate and organic titanium chelate compounds being particularly preferred. The condensation catalyst can be added in a proportion of 0.01 to 10 parts by weight, preferably 0.1 to 6 parts by weight per 100 parts by weight of the silicone resin. In this range, the resin composition has good curability, and also good storage stability.

As the addition-curable silicone resins, it is possible to use a combination of an organopolysiloxane having two or more alkenyl groups such as vinyl group per molecule and an organohydrogenpolysiloxane having two or more, preferably three or more SiH groups per molecule. Addition-curable silicone resin compositions comprising the alkenyl group-containing organopolysiloxane, the organohydrogenpolysiloxane, and a platinum catalyst can preferably be used. It is to be noted that the proportions of the organohydrogenpolysiloxane can be set at 10 to 1,000 parts by weight per 100 parts by weight of the alkenyl-containing organopolysiloxane and that the proportions of the platinum catalyst can be set at 1 to 500 ppm based on the organopolysiloxanes.

As the composite resins, a combination of a triazine derivative epoxy resin such as triglycidyl isocyanurate and a silicone resin are preferred. Thermosetting epoxy-silicone resin compositions comprising the triazine derivative epoxy resin, the silicone resin, an acid anhydride and a curing promoter are desired for their excellent curability, heat resistance and light resistance, and good strength. As the silicone resin, it is preferred to use the above-described silicone resin of the formula (1). The ratio of the epoxy resin to the silicone resin may preferably range from 10:90 to 90:10 by weight. The acid anhydride and the curing promoter are those described above and can be used in the amounts described above.

To obtain good moldability and to provide the resulting cured product having good physical properties, it is preferred that an epoxy resin and/or a silicone resin having at least one epoxy group per molecule, and an acid anhydride are subjected to a pre-reaction and the resulting pre-reaction product having an increased polymerization degree is used.

Especially for a reflector on which a high-luminance, light-emitting device capable of emitting light equal to or smaller than 500 nm is to be mounted, it is preferred to use a silicone resin or a composite resin of a silicone resin and an epoxy resin. The use of an epoxy resin alone or a thermoplastic polyphthalamide may result in degradation and discoloration of the resin by heat released upon light emission and short-wavelength light, thereby possibly leading to reductions in photoreflectance and light extraction efficiency.

Silicone resins are, therefore, desired as they are the best in heat resistance and light resistance. Among the silicone resins, those having high methyl group contents are preferred. For example, the silicone resins of the formula (1) in which $R^1$ is a methyl group can be suitably used.

With respect to the inorganic filler, it includes an oxide of a rare earth element (which may hereinafter be called "a rare earth element oxide") as an essential component. The term "rare earth elements" as used herein is a generic term for 18 elements, which includes 15 lanthanoid elements belonging to Group III of the periodic table and ranges from atomic numbers 57 to 71 (lanthanum, cerium, praseodymium, neodymium, promethium, samarium, europium, gadolinium, terbium, dysprosium, holmium, erbium, thulium, ytterbium and lutetium), and further, atomic numbers 21, 39 and 49 of the same Group III, that is, scandium, yttrium and indium.

Among these rare earth element oxides, oxides of yttrium, neodymium, indium, lanthanum, cerium, samarium, europium, gadolinium and dysprosium are preferred.

In the present invention, the rare earth element oxide is used by incorporating it in the resin composition, thereby making it possible to efficiently reflect light equal to or smaller than 500 nm. Of such rare earth element oxides, yttrium oxide, lanthanum oxide, cerium oxide, neodymium oxide, samarium oxide, europium oxide, gadolinium oxide, dysprosium oxide, and indium oxide are desired for their ready availability.

No particular limitation is imposed on the particle size of the rare earth element oxide. To increase the photoreflectance, it is necessary that the rare earth element oxide is evenly dispersed in the composition. Also with moldability and flowability in view, the average particle size may be preferably 0.5 to 60 μm, more preferably 0.5 to 50 μm, still more preferably 0.5 to 5 μm. To obtain a high reflectance with a small proportion, the rare earth element oxide may desirably have a small particle size and a large specific surface area. It is to be noted that the average particle size can be determined as a weight average diameter $D_{50}$ (or median size) in a particle size distribution measurement by laser diffraction analysis.

The proportion of the rare earth element oxide may be preferably 10 to 100% by weight, more preferably 20 to 90% by weight, still more preferably 30 to 80% by weight based on the whole inorganic filler to be incorporated and used. Per 100 parts by weight of the resin component, the rare earth element oxide may be used preferably as much as 10 to 900 parts by weight, with 50 to 500 parts by weight being particularly preferred. A proportion smaller than 10 parts by weight involves a potential problem in that no sufficient reflectance may be obtained, while a proportion in excess of 900 parts by weight may lead to short molding and lowered adhesion with a lead frame due to an increase in viscosity upon molding a reflector. More desirably, the proportion of the rare earth element oxide may be 50 to 400 parts by weight.

An inorganic filler other than the above-described rare earth element oxide can be incorporated in resin composition in addition to the rare earth element oxide. In this case, a commonly-used inorganic filler can be used as the other inorganic filler. Examples include silicas such as fused silica, fused spherical silica and crystalline silica, alumina, silicon nitride, aluminum nitride, boron nitride, glass fibers, and antimony trioxide. No particular limitation is imposed on the average particle size or shape of such an additional inorganic filler, but the average particle size may generally be 4 to 40 μm, with 7 to 35 μm being particularly preferred.

Among these, the oxide of an element selected from silicon, magnesium, titanium, zinc or aluminum is preferred. In particular, fused silica or fused spherical silica can be suitably used from the standpoints of moldability and flowability.

For providing the resulting reflector with enhanced strength and toughness, it is possible to incorporate such materials as will be described hereinafter. Illustrative are glass fibers, borosilicate glass, amorphous fibers such as rock wool, polycrystalline fibers such as alumina fibers, single-crystal fibers such as potassium titanate, calcium silicate, silicate glass and aluminum borate fibers, and further, magnesium sulfate, silicon carbide, silicon nitride, and the like. They can be used equally irrespective of their types.

To obtain a white reflector, the above-mentioned white rare earth element oxides may be used singly. In some instances, a white pigment described below may be used as an inorganic filler in combination.

As the white pigment to be used in combination with the white rare earth element oxides, titanium dioxide is preferred. The unit lattice of this titanium dioxide may be of any one of the rutile type, anatase type and brookite type. Preferably, the rutile type can be used. No particular limitation is imposed on the average particle size or shape of titanium dioxide to be used as a white pigment. In general, the average particle size may range from 0.05 to 5.0 μm. The titanium dioxide can be surface treated with a hydroxide of Al or Si to improve its compatibility to and dispersibility in the resin and inorganic filler.

As a white pigment (white colorant), it is also possible to use potassium titanate, zirconium oxide, zinc sulfide, zinc oxide, or magnesium oxide either singly or in combination with titanium dioxide.

To enhance the bond strength between the resin and the inorganic filler, the inorganic filler may be surface treated with a coupling agent such as a silane coupling agent or titanate coupling agent.

Preferably usable examples of such a coupling agent include epoxy-functional alkoxysilanes such as γ-glycidoxypropyltrimethylsilane, γ-glycidoxypropylmethyldiethoxysilane and β-(3,4-epoxycyclohexyl)ethyltrimethoxysilane, amino-functional alkoxysilanes such as N-β-(aminoethyl)-γ-aminopropyltrimethoxysilane, γ-aminopropyltriethoxysilane and N-phenyl-γ-aminopropyltrimethoxysilane, and mercapto-functional alkoxy silanes such as γ-mercaptopropyltrimethoxysilane. It is to be noted that no particular limitation is imposed on the amount of the coupling agent to be used in the surface treatment or on the method of the surface treatment.

The proportion of the other inorganic filler is the rest of the whole proportion of the inorganic filler, and may be preferably 0 to 90% by weight, more preferably 10 to 80% by weight, still more preferably 20 to 70% by weight of the whole inorganic filter. In this case, it is preferred to contain, as a white pigment, titanium dioxide as much as 1 to 30% by weight, more preferably 5 to 30% by weight and fused silica or fused spherical silica as much as 5 to 79% by weight, more preferably 10 to 65% by weight of the whole inorganic filler.

The proportion of the inorganic filler may be preferably 50 to 1,000 parts by weight, more preferably 100 to 900 parts by weight, still more preferably 200 to 850 parts by weight per 100 parts by weight of the organic resin.

An excessively small proportion of the inorganic filler may provide the resulting reflector with a lowered photoreflectance so that a light-emitting semiconductor unit may be unable to produce sufficient brightness in some instances. An unduly large proportion of the inorganic filler, on the other hand, may lead to a reduction in flowability due to an increased melt viscosity of the resin composition so that an inconvenience such as short molding may arise upon molding the reflector.

In the resin composition according to the present invention, various additives can be incorporated as needed. To improve the properties of the resin, for example, additives such as various silicone powders, thermoplastic resins, thermoplastic elastomers, organic synthetic rubbers, and internal mold release agents, e.g., fatty acid esters, glycerate esters, zinc stearate and calcium stearate, can be added and incorporated to such extent as not impairing the advantageous effects of the present invention.

As the most general process for molding reflectors with the resin composition according to the present invention, low-pressure transfer molding or compression molding can be mentioned. The molding of the resin composition according to the present invention may desirably be performed at 130 to 185° C. for 30 to 180 seconds. Postcure may be conducted at 150 to 185° C. for one to eight hours.

The photoreflectance at 360 to 800 nm of a cured product obtained by curing the thermosetting resin composition according to the present invention, which contains the above-described components as essential components, may preferably be 80% or higher as an initial value. A reflectance of 90% or higher at 400 nm is more desired.

The resin composition according to the present invention can be suitably used for the molding of a reflector for a light-emitting semiconductor device. In this application, the resin composition is molded and cured into the form of an adequate reflector.

The reflector can be any reflector insofar as it can reflect light emitted from the light-emitting semiconductor device, and its shape can be selectively determined depending on the details of a light-emitting semiconductor unit. Examples of the reflector include a flat-plate reflector and a recessed reflector. The flat-plate reflector is configured such that the reflector can fill up spaces between a die pad on which the light-emitting semiconductor device is mounted, and leads via which electrodes of the light-emitting semiconductor device and external electrodes are connected together, respectively. On the other hand, the recessed reflector is configured as a ring-shaped wall member such that the reflector can be arranged on leads via which electrodes of a light-emitting semiconductor device and external electrodes are connected together, respectively, or a die pad on which the leads and the electrodes of the light-emitting semiconductor device are mounted, and can accommodate the light-emitting semiconductor device therein. In the recessed reflector, the reflector may be configured to fill up between the leads or between the leads and the die pad in continuation with the ring-shaped wall member.

Therefore, the present invention also provides a light-emitting semiconductor unit having a light-emitting semiconductor device, leads connecting electrodes of the light-emitting semiconductor device with external electrodes, respectively, and a reflector for the light-emitting semiconductor device composed of a cured product of the resin composition according to the present invention, and the light-emitting semiconductor device is sealed with a transparent resin or a phosphor-containing transparent resin.

Figure 1A:
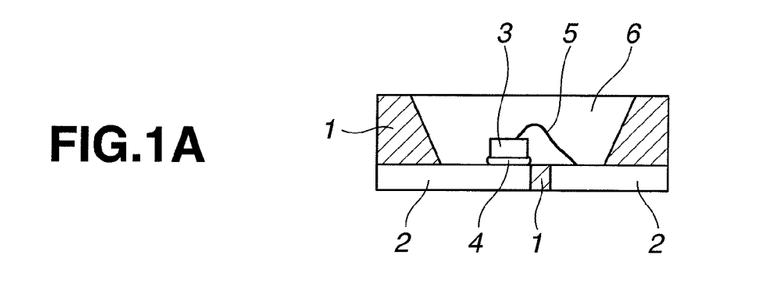
Figure 1B:
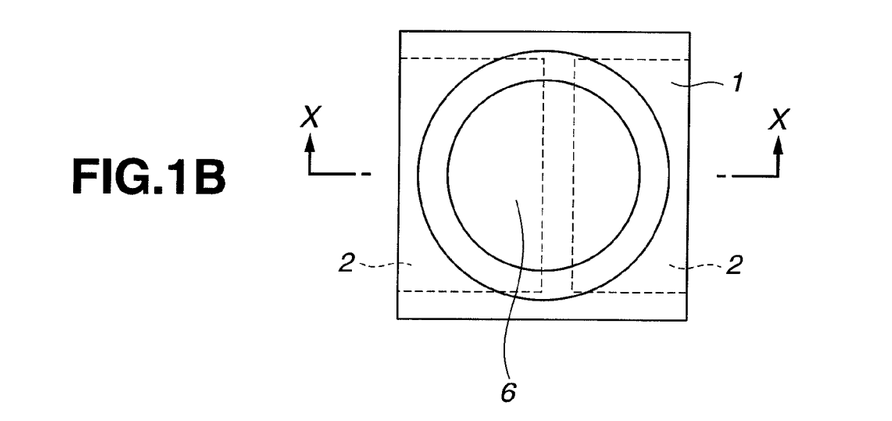

FIGS. 1A and 1B illustrate, by way of one example, a reflector according to the present invention for a light-emitting semiconductor device and a light-emitting semiconductor unit making use of the reflector. In the figures, there are shown the reflector 1, a metal lead frame 2, the light-emitting semiconductor device 3, a die-bonding material 4, gold wires 5, and a transparent sealing resin 6 that seals the light-emitting semiconductor device 3. The metal lead frame 2 has a die pad and leads. The light-emitting semiconductor device 3 is mounted on the die pad. The leads connect electrodes of the semiconductor device to external electrodes. The reflector 1 is in the form of a recessed body, which is composed of portions and a ring-shaped wall section integrally molded together. The portions are interposed between the die pad and the leads to fill up the spaces between the die pad and the leads. The ring-shaped wall section accommodates therein the light-emitting semiconductor device 3 and gold wires 5 above the die pad and leads.

Figure 2:
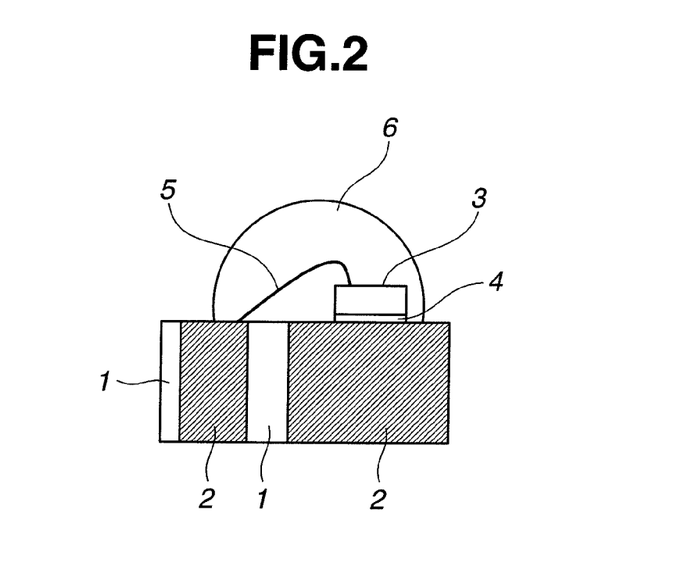
FIG. 2 is a cross-sectional view showing a flat-plate reflector.

FIG. 2 illustrates a flat-plate reflector interposed between the die pad and the leads to fill up the spaces between the die pad and the leads, in which like reference numerals indicate like parts as in FIG. 1.

When manufacturing reflectors, they may be discretely molded. As an alternative, reflectors as many as 100 to 300 pieces may be molded on a metal frame such that they are arrayed in a matrix form.

Figure 3A:
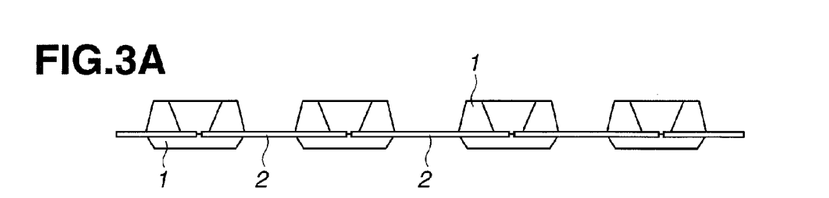
Figure 3B:
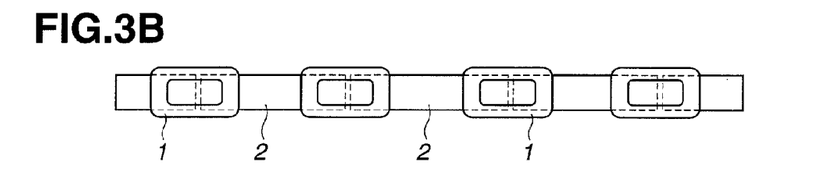

FIGS. 3A and 3B illustrate discretely-molded reflectors. One example of their manufacturing process will be specifically described. After molding, lead cutting and lead bending are performed to cut off the reflectors from the lead frame. Also referring to FIGS. 1A and 1B, a light-emitting semiconductor device 3 is held in place on each cut reflector 1 with a die-bonding silicone material 4 (for example, "LPS632D," trade name, product of Shin-Etsu Chemical Co., Ltd.). Heating is then conducted, for example, at 150° C. for one hour to fixedly secure the light-emitting semiconductor device on the die pad. Subsequently, the light-emitting semiconductor device and inner ends of the leads are electrically connected via the gold wires 5. Further, a transparent silicone resin (for example, "LPSVVV," trade name, product of Shin-Etsu Chemical Co., Ltd.), a silicone resin with a phosphor incorporated therein is cast into a recess of the reflector by potting, and is then heated and cured, for example, at 120° C. for one hour and then at 150° C. for two hours to seal the resulting light-emitting semiconductor unit.

Figure 4:
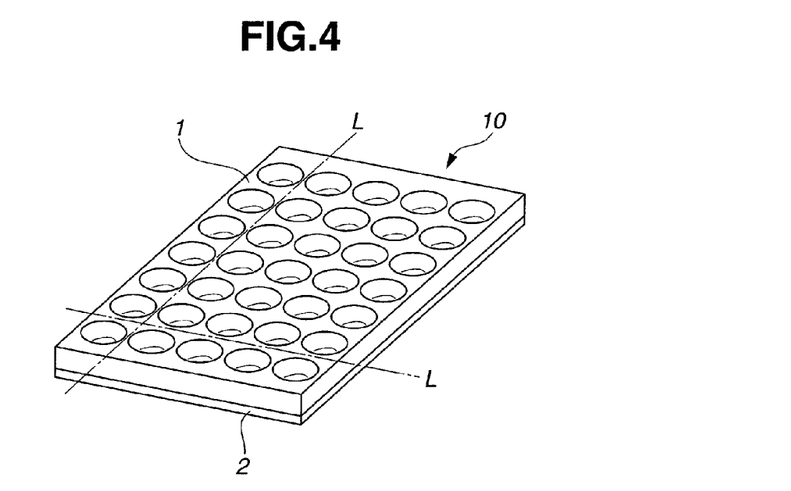
FIG. 4 is a perspective view depicting one example of matrix-type recessed reflectors.
Figure 5A:
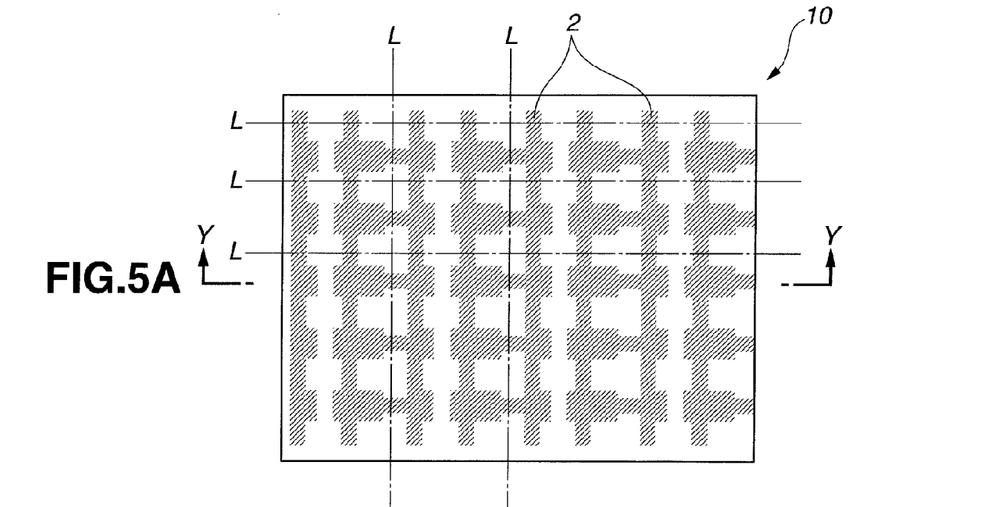
Figure 5B:
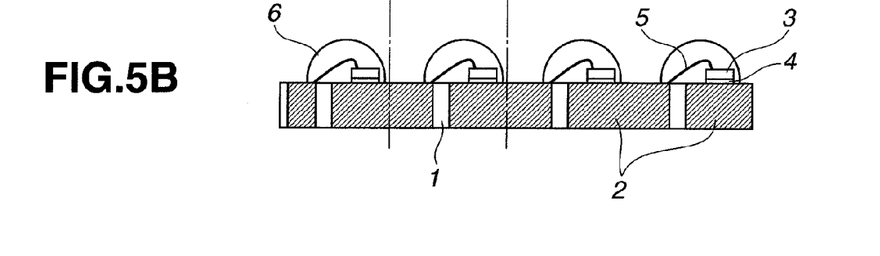

FIG. 4 illustrates reflectors of the above-described recessed shape arrayed in a matrix form on a reflector substrate 10, and FIGS. 5A and 5B illustrate reflectors of the above-described flat plate shape arrayed in a matrix form on a reflector substrate 10. In FIGS. 4 and 5A, solid lines L indicate cut lines for the reflector substrates 10. The reflector substrate 10 with the reflectors 1 arrayed in the matrix form thereon as shown in FIGS. 5A and 5B is manufactured as will be described hereinafter. Before cutting the reflector substrate 10, light-emitting semiconductor devices are held in place with the above-described silicone die-bonding material on die pads which exist in the recesses of the respective reflectors. Heating is then conducted at 150° C. for one hour to fixedly secure the light-emitting semiconductor devices. Subsequently, the light-emitting semiconductor devices and the inner ends of leads are electrically connected via gold wires. Further, a transparent silicone resin 6 (for example, "LPS380," trade name, product of Shin-Etsu Chemical Co., Ltd.) or "LPS380" with a phosphor incorporated therein is cast into the recesses of the reflectors by potting, and is then heated and cured, for example, at 120° C. for one hour and then at 150° C. for two hours to seal the resulting light-emitting semiconductor units. The sealing with the transparent silicone resin can simultaneously form the resulting seals in the form of lenses by a sealing method such as transfer molding or compression molding.

Subsequently, the reflector substrate 10 with the reflectors 1 arrayed in the matrix form thereon is cut by dicing, laser machining, or water jet machining to separate the reflectors 1 into discrete pieces.

In the above-described examples, each light-emitting semiconductor device and the inner ends of the corresponding leads are electrically connected via the gold wires. The connection method is not limited to this method. Each light-emitting semiconductor device and the inner ends of the corresponding leads may be connected by using bumps such as Au bumps.

The reflector according to the present invention is desired as a reflector for a short-wavelength, light-emitting semiconductor device, specifically a light-emitting semiconductor device having emission wavelengths of preferably up to 500 nm, more preferably 300 to 500 nm, still more preferably 400 to 500 nm, or for a blue or ultraviolet LED. Further, the reflector according to the present invention can also be effectively used as a sealing member for a semiconductor or electronic device, or as a premolded package adapted to accommodate an element of a concentrating solar cell.

EXAMPLES

The present invention will hereinafter be described specifically based on Examples and Comparative Examples. However, the present invention is not limited to the following Examples.

Materials used in the Examples and Comparative Examples will be described below.

Silicone Resins

Synthesis Example 1

Methyltrichlorosilane (100 parts by weight) and toluene (200 parts by weight) were placed in a 1-L flask. Under ice cooling, a mixed solution of water (8 parts by weight) and methyl alcohol (60 parts by weight) was added dropwise. The dropwise addition was conducted at an internal temperature of −5 to 0° C. over 5 to 20 hours. Subsequently, the resulting mixture was heated, and was then stirred at a reflux temperature for 20 minutes. The reaction mixture was then allowed to cool to room temperature, and water (12 parts by weight) was added dropwise at 30° C. or lower in 30 minutes, followed by stirring for 20 minutes. After water (25 parts by weight) was further added dropwise, stirring was conducted at 40 to 45° C. for 60 minutes. Subsequently, water (200 parts by weight) was added, and the resulting organic layer was separated. The organic layer was washed until it became neutral. After that, the resulting organic solution was subjected to azeotropic dehydration, filtration and vacuum stripping, thereby obtaining a white thermosetting silicone resin (A-1) represented by the following formula (2) as a colorless clear solid (melting point: 76° C., yield: 36.0 parts by weight).

$$(CH_3)_{1.0}Si(OCH_3)_{0.06}(OH)_{0.11}O_{1.42} \tag{2}$$

Synthesis Example 2

Methyltrichlorosilane (50 parts by weight) phenyltrichlorosilane (70.6 parts by weight) and toluene (200 parts by weight) were placed in a 1-L flask. Under ice cooling, a mixed solution of water (8 parts by weight) and methyl alcohol (60 parts by weight) was added dropwise. The dropwise addition was conducted at an internal temperature of −5 to 0° C. over 5 to 20 hours. Subsequently, the resulting mixture was heated, and was then stirred at a reflux temperature for 20 minutes. The reaction mixture was then allowed to cool to room temperature, and water (12 parts by weight) was added dropwise at 30° C. or lower in 30 minutes, followed by stirring for 20 minutes. After water (25 parts by weight) was further added dropwise, stirring was conducted at 40 to 45° C. for 60 minutes. Subsequently, water (200 parts by weight) was added, and the resulting organic layer was separated. The organic layer was washed until it became neutral. After that, the resulting organic solution was subjected to azeotropic dehydration, filtration and vacuum stripping, thereby obtaining a white thermosetting silicone resin (A-2) represented by the following formula (3) as a colorless clear solid (melting point: 82° C., yield: 45.0 parts by weight).

$$(CH_3)_{0.5}(C_6H_5)_{0.5}Si(OCH_3)_{0.05}(OH)_{0.13}O_{1.41} \tag{3}$$

Epoxy Resin
  Triazine derivative epoxy resin: tris(2,3-epoxypropyl) isocyanurate ("TEPIC-S," trade name, product of Nissan Chemical Industries, Ltd.; epoxy equivalent: 100)
Curing Agent
  Acid anhydride: methylhexahydrophthalic anhydride ("RIKACID MH," trade name, product New Japan Chemical Co., Ltd.)

Synthesis Example 3

B-Staged Epoxy Resin
  Tris(2,3-epoxypropyl) isocyanurate ("TEPIC-S," trade name, product of Nissan Chemical Industries, Ltd.; 45 parts by weight), methylhexahydrophthalic anhydride ("RIKACID MH," trade name, product of New Japan Chemical Co., Ltd.; 55 parts by weight) and triphenyl phosphite (3 parts by weight) were placed in a reaction vessel, and were then reacted at 80° C. for 10 hours. After the reaction, a prepolymer was taken out, and was then cooled to solidify a B-staged epoxy resin (A-3).
Antioxidant
  Phosphorus-based antioxidant: triphenyl phosphite (product of Wako Pure Chemical Industries, Ltd.)
Curing Catalysts
  Curing Catalysts for Epoxy Resins
  Phosphorus-based curing catalyst: methyl-tributyl-phosphonium-dimethylphosphate ("PX-4 MP," trade name, product of Nippon Chemical Industrial Co., Ltd.)
  Curing catalyst for silicone resins: zinc benzoate
Inorganic Fillers
  Fused spherical silica (product of Tatsumori Ltd.; average particle size: 15 μm)
  Spherical alumina (product of Admatechs Company Limited; average particle size: 20 μm)
  Titanium dioxide, rutile type ("R-45M," trade name, product of Sakai Chemical Industry Co., Ltd.; average particle size: 0.28 μm)
Rare Earth Element Oxides
  Yttrium oxide (A) (product of Shin-Etsu Chemical Co., Ltd.; average particle size: 10 μm)

Yttrium oxide (B) (product of Shin-Etsu Chemical Co., Ltd.; average particle size: 5 μm)

Lanthanum oxide (product of Shin-Etsu Chemical Co., Ltd.; average particle size: 13 μm)

Cerium oxide (product of Shin-Etsu Chemical Co., Ltd.; average particle size: 15 μm)

Gadolinium oxide (product of Shin-Etsu Chemical Co., Ltd.; average particle size: 12 μm)

Other Additives

Mold release agent: calcium stearate

Silane coupling agent: 3-mercaptopropyl trimethoxysilane ("KBM-803," trade name, product of Shin-Etsu Chemical Co., Ltd.)

Examples 1 to 8 & Comparative Examples 1 to 3

Each white epoxy composition was obtained by combining various components in the corresponding proportions shown in Table 1, mixing them into a homogeneous mass and then kneading the mass on a hot two-roll mill. The compositions obtained as described above were measured for various physical properties by the below-described measuring methods. The results are also described in Table 1.

Gel Time

The time until gel formation on a hot plate of 175° C. was measured.

Melt Viscosity

Using a Koka flow tester and a nozzle of 1 mm in diameter, the viscosity was measured at 175° C. under increased pressure of 10 kgf.

Photoreflectance

A disk of 50 mm diameter×3 mm thickness was molded under the conditions of 175° C., 6.9 N/mm$^2$ and two minutes molding time. Using the disk, the photoreflectance was measured in a wavelength range of 360 nm to 740 nm by an "X-rite8200" (trade name, manufactured by S.D.G. K.K.).

Photoreflectance after Exposure to Ultraviolet Ray

A disk of 50 mm diameter×3 mm thickness was molded under the conditions of 175° C., 6.9 N/mm$^2$ and two minutes molding time. After the disk was exposed to an ultraviolet ray of 405 nm for 24 hours in an atmosphere of 120° C., the photoreflectance was measured.

Luminous Intensity

Under an atmosphere of 150° C., a current of 100 mA was applied to each light-emitting semiconductor unit fabricated in Example 9 to be described subsequently herein. At the time of the initiation of the test and also after 100 hours, the luminous intensity was measured by an "LP-3400" (trade name, manufactured by Otsuka Electronics Co., Ltd.) to determine a reduction in luminance.

TABLE 1

| Formulation of Resin composition | Example | | | | | | | | Comparative Example | | |
|---|---|---|---|---|---|---|---|---|---|---|---|
| (parts by weight) | 1 | 2 | 3 | 4 | 5 | 6 | 7 | 8 | 1 | 2 | 3 |
| TEPIC-S | 28 | | | | | 45 | | | | | |
| B-staged epoxy resin (A3) | | 75 | | | | | 100 | | | 75 | |
| RIKACID MH | 34 | | | | | 55 | | | | | |
| Silicone resin (A-1) | 37 | 25 | 100 | | | | | 100 | 100 | 25 | |
| Silicone resin (A-2) | | | | 100 | 100 | | | | | | 100 |
| Titanium dioxide | 80 | 80 | 50 | 50 | | 50 | 80 | | 80 | 80 | |
| Yttrium oxide (A) | 160 | | 410 | 100 | 205 | | | 50 | | 3 | |
| Yttrium oxide (B) | | | | | | | | 205 | | | |
| Lanthanum oxide | | 175 | | | | | | | | | |
| Cerium oxide | | | | | | | | 80 | | | |
| Gadolinium oxide | | | | | | 160 | | | | | |
| Fused spherical silica | 135 | 135 | 90 | 130 | 100 | 130 | 160 | 100 | 200 | 200 | 100 |
| Spherical alumina | | | | | | | | | | | 162 |
| KBM-803 | 1 | | 1 | | | 1 | | | 1 | | |
| Curing catalyst (PX-4MP) | 1 | 1 | | | | 1 | 1 | | | 1 | |
| Curing catalyst (zinc benzoate) | | 1 | 1 | 1 | 1 | | | 1 | 1 | 1 | 1 |
| Calcium stearate | 1 | 1 | 1 | 1 | 1 | 1 | 1 | 1 | 1 | 1 | 1 |

With respect to these compositions, the following various characteristics were measured. The results are shown in Tables 2 and 3.

Spiral Flow Value

Using a mold conforming to the EMMI standards, the spiral flow value was measured under the conditions of 175° C., 6.9 N/mm$^2$ and two minutes molding time.

TABLE 2

| | | Example | | | | | | | | Comparative Example | | |
|---|---|---|---|---|---|---|---|---|---|---|---|---|
| | | 1 | 2 | 3 | 4 | 5 | 6 | 7 | 8 | 1 | 2 | 3 |
| Spiral flow (inches) | | 28 | 30 | 19 | 22 | 18 | 28 | 29 | 17 | 19 | 32 | 15 |
| Gel time (seconds) | | 16 | 15 | 10 | 11 | 9 | 17 | 15 | 10 | 10 | 17 | 9 |
| Melt viscosity (Pa · s) | | 7 | 4 | 10 | 5 | 7 | 5 | 6 | 8 | 3 | 2 | 8 |
| Initial reflectance | 450 nm | 95 | 95 | 95 | 96 | 97 | 95 | 92 | 96 | 89 | 88 | 90 |
| (%) | 400 nm | 92 | 93 | 93 | 93 | 95 | 92 | 86 | 95 | 45 | 42 | 81 |
| | 360 nm | 82 | 82 | 82 | 81 | 83 | 81 | 80 | 85 | 9 | 7 | 65 |

TABLE 2-continued

|  |  | Example | | | | | | | | Comparative Example | | |
|---|---|---|---|---|---|---|---|---|---|---|---|---|
|  |  | 1 | 2 | 3 | 4 | 5 | 6 | 7 | 8 | 1 | 2 | 3 |
| Reflectance after exposed to ultraviolet ray (%) | 450 nm | 91 | 90 | 95 | 95 | 96 | 87 | 88 | 95 | 88 | 80 | 89 |
|  | 400 nm | 86 | 88 | 93 | 93 | 93 | 81 | 81 | 92 | 35 | 30 | 77 |
|  | 360 nm | 75 | 78 | 81 | 80 | 80 | 68 | 65 | 80 | 7 | 4 | 56 |

Example 9 & Comparative Example 4

Using copper lead frames with silver plating applied to all the surfaces thereof, matrix-type recessed reflectors of FIG. 4 and discrete-type reflectors of FIG. 3 were molded with the thermosetting resin compositions produced in Examples 1 to 8 and Comparative Examples 1 to 3, respectively, under the following molding conditions:
Molding temperature: 170° C.
Molding pressure: 6.9 N/mm²
Molding time: 3 minutes.
Postcure was then conducted at 170° C. for two hours.
In each package molded as described above, the adhesion between the leads and the resin was also good.

For the evaluation of the above-described premolded packages, LED devices which had a main emission peak at 357 nm were used as light-emitting semiconductor devices, that is, LED devices. The LED devices were mounted and held in place with a silicone die-bonding material ("LPS632D," trade name, product of Shin-Etsu Chemical Co., Ltd.) on predetermined bottom parts in recessed openings of the molded reflectors, and the inner ends of leads of the copper lead frame and the electrodes of the LED devices were electrically connected via gold wires. Subsequently, a silicone sealing material ("LPS380," trade name, product of Shin-Etsu Chemical Co., Ltd.) was injected into the recessed openings in which the LED devices were arranged. The silicone sealing material was then cured at 120° C. for one hour and then at 150° C. for one hour to seal the resulting light-emitting semiconductor units.

With respect to each of the thermosetting resin compositions produced in Examples 1 to 8 and Comparative Examples 1 to 3, the light-emitting semiconductor units assembled by using the matrix-type reflectors and discrete-type reflectors, respectively, were provided as many as five units per each reflector type. After those light-emitting semiconductor units were left over for 48 hours in an atmosphere controlled at 25° C. and 80% RH, the light-emitting semiconductor units were passed three times through a reflow tunnel oven controlled at 260° C. Subsequently, the light-emitting semiconductor units were examined for adhesion failure between the package surfaces or device surfaces and the sealing resin. The light-emitting semiconductor units, which used the packages molded of the compositions of the present invention, respectively, developed absolutely no separation defect. For a luminance intensity test, the light-emitting semiconductor units were also provided as many as five devices per each reflector type with respect to each of the thermosetting resin compositions produced in Examples 1 to 8 and Comparative Examples 1 to 3. Under an atmosphere of 150° C., a current of 100 mA was applied to each light-emitting semiconductor unit. At the time of the initiation of the test and also after 100 hours, the luminous intensity was measured to determine reductions in luminance. Supposing, as 1.0, the luminances (initial values) of the light-emitting semiconductor units, which used the reflectors produced with the resin composition of Comparative Example 1, at the time of the initiation of the test, the luminances of the respective light-emitting semiconductor units are indicated by relative values.

TABLE 3

| Reflector | Resin composition | Luminance (relative value) | |
|---|---|---|---|
|  |  | Initial value | After deterioration |
| Matrix-type reflector | Example 1 | 1.3 | 1.2 |
|  | Example 2 | 1.3 | 1.2 |
|  | Example 3 | 1.4 | 1.3 |
|  | Example 4 | 1.4 | 1.3 |
|  | Example 5 | 1.5 | 1.4 |
|  | Example 6 | 1.2 | 1.1 |
|  | Example 7 | 1.2 | 1.1 |
|  | Example 8 | 1.4 | 1.3 |
|  | Comparative Example 1 | 1.0 | 0.7 |
|  | Comparative Example 2 | 0.9 | 0.6 |
|  | Comparative Example 3 | 1.2 | 1.1 |
| Discrete-type reflector | Example 1 | 1.3 | 1.3 |
|  | Example 2 | 1.4 | 1.3 |
|  | Example 3 | 1.4 | 1.4 |
|  | Example 4 | 1.5 | 1.4 |
|  | Example 5 | 1.6 | 1.5 |
|  | Example 6 | 1.3 | 1.2 |
|  | Example 7 | 1.3 | 1.3 |
|  | Example 8 | 1.5 | 1.4 |
|  | Comparative Example 1 | 1.0 | 0.6 |
|  | Comparative Example 2 | 0.9 | 0.6 |
|  | Comparative Example 3 | 1.2 | 1.1 |

Japanese Patent Application No. 2010-078036 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resin composition comprising:
100 parts by weight of an organic resin selected from the group consisting of polyphthalamide, epoxy resins, silicone resins, and composite resins in the form of a triazine derivative epoxy resin and a silicone resin, and
50 to 1,000 parts by weight of an inorganic filler based on 100 parts by weight of an organic resin, wherein 30 to 100% by weight of the inorganic filler is composed of an oxide of a rare earth element selected from the group consisting of yttrium, neodymium, indium, lanthanum, cerium, samarium, europium, gadolinium, and dysprosium.

2. The resin composition according to claim 1, wherein 5 to 100% by weight of the organic resin is composed of a silicone resin.

3. The resin composition according to claim 1, wherein the oxide of the rare earth element is in the form of a powder having an average particle size of 0.5 to 60 μm.

4. The resin composition according to claim 1, further comprising, as an inorganic filler other than the oxide of the rare earth element, an oxide of an element selected from silicon, magnesium, titanium, zinc or aluminum.

5. The resin composition according to claim 1, which is for the molding of a reflector for a light-emitting semiconductor device.

6. A reflector for a light-emitting semiconductor device, comprising a cured product of a resin composition of claim 1.

7. The reflector according to claim 6, which is in the form of a flat plate configured such that the reflector can fill up between a die pad on which a light-emitting semiconductor device is mounted, and leads via which electrodes of the light-emitting semiconductor device and external electrodes are connected together, respectively.

8. The reflector according to claim 6, which is in the form of a recessed body configured as a ring-shaped wall member such that the reflector can be arranged on leads via which electrodes of a light-emitting semiconductor device and external electrodes are connected together, respectively, or a die pad on which the leads and the electrodes of the light-emitting semiconductor are mounted, and can accommodate the light-emitting semiconductor device therein.

9. The reflector according to claim 8, wherein the reflector is configured to fill up between the leads or between the leads and the die pad in continuation with the ring-shaped wall member.

10. A light-emitting semiconductor unit comprising:
a light-emitting semiconductor device;
leads connecting electrodes of the light-emitting semiconductor device with external electrodes, respectively; and
a reflector for a light-emitting semiconductor device according to claim 8, including a cured product of a resin composition, the resin composition including 100 parts by weight of an organic resin and 50 to 1,000 parts by weight of an inorganic filler based on 100 parts by weight of an organic resin, wherein 10 to 100% by weight of the inorganic filler is composed of an oxide of a rare earth element,
wherein the light-emitting semiconductor device is sealed with a transparent resin or a transparent resin includes a phosphor.

11. The light-emitting semiconductor unit according to claim 10, wherein the light-emitting semiconductor device has emission wavelengths of not longer than 500 nm.

12. The resin composition according to claim 1, wherein the rare earth element is yttrium, lanthanum, cerium or gadolinium.

13. The resin composition according to claim 1, wherein the amount of the inorganic filler is 100 to 900 parts by weight per 100 parts by weight of the organic resin.

14. The resin composition according to claim 13, wherein the amount of the inorganic filler is 200 to 850 parts by weight per 100 parts by weight of the organic resin.

15. The resin composition according to claim 1, wherein the amount of the rare earth element oxide is 50 to 500 parts by weight per 100 parts by weight of a resin component.

* * * * *